(12) United States Patent
Goldsmith et al.

(10) Patent No.: US 8,525,185 B2
(45) Date of Patent: Sep. 3, 2013

(54) RF-MEMS CAPACITIVE SWITCHES WITH HIGH RELIABILITY

(75) Inventors: Charles L. Goldsmith, Plano, TX (US);
Orlando H. Auciello, Bolingbrook, IL (US); John A. Carlisle, Romeoville, IL (US); Suresh Sampath, Santa Barbara, CA (US); Anirudha V. Sumant, Plainfield, IL (US); Robert W. Carpick, Philadelphia, PA (US); James Hwang, Bethlehem, PA (US); Derrick C. Mancini, Riverside, IL (US); Chris Gudeman, Santa Barbara, CA (US)

(73) Assignee: UChicago Argonne, LLC, Argonne, IL (US)

( * ) Notice: Subject to any disclaimer, the term of this patent is extended or adjusted under 35 U.S.C. 154(b) by 163 days.

(21) Appl. No.: 13/081,683

(22) Filed: Apr. 7, 2011

(65) Prior Publication Data

US 2012/0193685 A1  Aug. 2, 2012

Related U.S. Application Data

(60) Provisional application No. 61/321,563, filed on Apr. 7, 2010, provisional application No. 61/347,743, filed on May 24, 2010.

(51) Int. Cl.
*G01L 9/00* (2006.01)

(52) U.S. Cl.
USPC 257/77; 257/419; 257/E27.006; 257/E29.167

(58) Field of Classification Search
USPC .................... 257/77, 419, E27.006, E29.167
See application file for complete search history.

(56) References Cited

U.S. PATENT DOCUMENTS 7,317,232 B2 * 1/2008 Busta ........................... 257/415

* cited by examiner

*Primary Examiner* — Minh-Loan T Tran
(74) *Attorney, Agent, or Firm* — Thomas W. Tolpin; Tolpin & Partners, PC

(57) ABSTRACT

A reliable long life RF-MEMS capacitive switch is provided with a dielectric layer comprising a "fast discharge diamond dielectric layer" and enabling rapid switch recovery, dielectric layer charging and discharging that is efficient and effective to enable RF-MEMS switch operation to greater than or equal to 100 billion cycles.

17 Claims, 6 Drawing Sheets

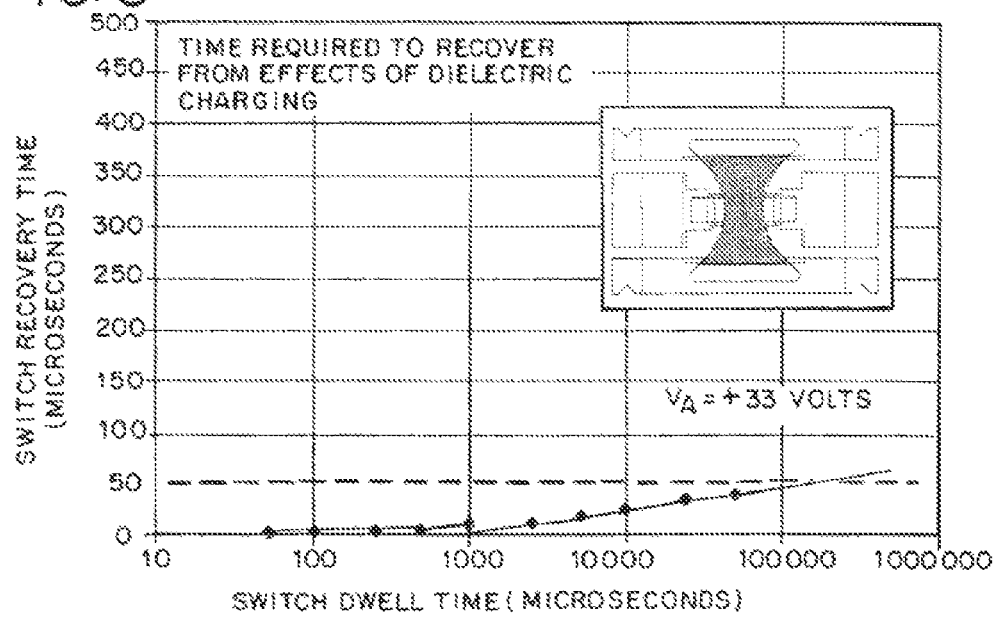

RF-MEMS CAPACITIVE SWITCHES WITH HIGH RELIABILITY

STATEMENT REGARDING FEDERALLY SPONSORED RESEARCH OR DEVELOPMENT

The United States Government has rights in this invention pursuant to Contract No. DE-FG02-02ER46016 between the U.S. Department of Energy (DOE) and UChicago Argonne, LLC representing Argonne National Laboratory and pursuant to Contract No. MIPR06-W238 between the Defense Advanced Research Projects Agency (DARPA) and UChicago Argonne, LLC representing Argonne National Laboratory.

BACKGROUND OF THE INVENTION

This invention relates to electrostatically operated microelectromechanical systems (MEMS) devices involving integrated dielectric layers, particularly capacitive switches and more particularly, to radio frequency (RF) microelectromechanical systems (MEMS) capacitive switches.

RF-MEMS capacitive switches have many useful applications for military and commercial RF and microwave applications. A RF-MEMS capacitive switch comprises a movable metal membrane (upper electrode) suspended above a lower electrode and interposing dielectric layer. An alternative configuration for RF-MEMS switches includes a separate upper electrode (which can be used as a pull-up electrode) positioned above the membrane and physically separated from the latter. An air gap of several microns typically separates the upper membrane from the dielectric layer. The lower electrode comprises a RF signal path, while the upper electrode, whether separate or being the membrane) comprises a RF and DC ground. In the switch "off state", the air gap between the membrane and lower electrode is sufficient that the upper membrane has an insignificant parasitic capacitance relative to the operating frequency of the switch. When a voltage is applied across the upper and lower electrodes, the electrostatic force pulls the membrane down into contact with the dielectric layer ("on state"). Without a significant air gap, the upper metal membrane, insulator layer, and lower metal electrode form an MIM (metal-insulator-metal) capacitor. This capacitor is designed to achieve sufficient capacitive conductance such that it can capacitively couple, or even short, the RF signal path of the lower electrode to the grounded upper metal membrane. When the applied voltage is released, the restoring force of the membrane metal spring is sufficient to return the membrane to its "off state", if no secondary effects impede that action, such as charging of the dielectric layer on top of the bottom electrode, and/or force of adhesion between the membrane and the dielectric layer, due to the chemical state (hydrophilic nature of the surface or water adsorption capability-high hydrophilicity may result in strong force of adhesion between two surfaces) of the surface of the membrane and/or the dielectric layer RF-microelectromechanical switches (RF-MEMS switches) provide many potential benefits over conventional semiconductor-based switches for controlling and routing microwave and millimeter-wave signals. RF-MEMS switches possess very low insertion loss, miniscule power consumption, and ultrahigh linearity. These characteristics make RF-MEMS switches ideal candidates for incorporation into passive circuits, such as phase shifters or tunable filters, for implementation in communications and radar systems at RF, microwave, and millimeter-wave frequencies (10 MHz-100 GHz and up).

Despite the excellent RF performance of these devices, their insertion into military and/or commercial high frequency systems has been limited by a lack of reliability. In a well-engineered RF-MEMS switch, dielectric charging in the dielectric layer positioned on top of the bottom electrode is the main limitation to lifetime, as opposed to mechanical effects. When the switch actuates, a relatively high voltage (30-50 volts) is applied across the relatively thin insulator-dielectric layer on top of the bottom electrode. The resulting electric field induces charge (electrons) tunneling into the insulator-dielectric layer, where they are trapped. As these charges build up, they shift the pull-in and release voltages of the switch. If enough charges become trapped, the operating voltages will shift sufficiently such that the switch will either remain stuck down, or not actuate when desired. In either case, the switch fails to operate properly.

Furthermore, while the RF performance of these devices can be appropriate for a commercial device, from the electromagnetic signal transport point of view, reliability issues have limited their deployment into military and commercial low and high-frequency RF systems. In the case of capacitive RF-MEMS switches, shortcomings relating to dielectric charging have been difficult to mitigate. There are many solutions for lessening the impact of dielectric charging, including hermetic packaging, minimizing the electric field across the dielectric layer, and tailoring the polarity and waveform of bias control signals to minimize charging. These solutions have provided significant improvements in reliability, but have not proven enough to overcome the "stigma" associated with dielectric charging.

Commercially available RF-MEMS switches use silicon dioxide ($SiO_2$) or silicon nitride ($Si_3N_4$) as a dielectric layer material in a capacitive switch. During operation, charges become trapped in the dielectric layer building-up over time. As the charge builds-up, the operation of the device degrades until it fails. In fact, it fails very slowly. Studies have shown that the charge and discharge time constants for $SiO_2$ and silicon nitride $Si_3N_4$ dielectric layers are on the order of 10 s of seconds to 100 s of seconds. After failure, a device may take days to recover because charges trapped in the dielectric layer take a long time (100 s of seconds) to be transported to and be neutralized at the metal electrodes of the capacitor. The amount of charge accumulated is exponentially related to the applied electric field. The higher the operating voltages, the longer the switches are left in the "on state". Furthermore, the higher the operating temperature, generally the faster the switch will fail.

More specifically, prior art RF-MEMS capacitive switches with oxide or nitride dielectric layers are designed in such a way that the charges accumulate as slowly as possible. Prior switches slowly degrade until the point of failure. Switches with oxide or nitride dielectrics possess inherently long discharging time constants. Charging and discharging time constants are approximately equal. Therefore, once failure has occurred, conventional prior art devices are not available for proper operation for a very long time period, rendering the device essentially useless for a majority of applications and uses.

The primary failure mode of conventional prior art RF-MEMS capacitive switches is accumulation of charges (electrons) within the insulator layer made of silicon oxide or silicon nitride materials of the switch, in which charges tunnel into and become trapped within the dielectric. The conventional prior art RF-MEMS capacitive switch only recovers from this failure after a sufficiently long period of time (hours to days) during which the trapped charges can diffuse or migrate back to the metal electrodes.

Several techniques have been developed to mitigate the effects of dielectric charging on switch reliability, such as minimizing the operating conditions that lead to dielectric charging. For example, increased switching on-time or high operating voltage, and/or temperature result in less reliable operation. However, the designer does not often have control over these parameters. Alternatively, design modifications can be made to the switch to enable reliable operation. One alternative is to minimize the amount of dielectric material within the switch to form a mechanical support of the membrane layer. The dielectric insulating material is patterned into "posts", which support the membrane, but minimize the amount of contact between the dielectric and the membrane, instead of a metal-insulator-metal capacitive switch, it is more properly described as a metal-air-metal switch. This modification trades capacitance ratio (ratio of on-capacitance to off-capacitance) for improved reliability.

An alternative method of reducing dielectric charging is to engineer the chemical or microstructural makeup of the dielectric layer such that it has tailored conductivity, while still maintaining good dielectric behavior. The layer with tailored electrical conductivity is defined as "fast discharge dielectric layer" for the purpose of this invention, and this term will be used heretofore in this patent. Given sufficient conduction within the dielectric, the trapped charges will have more opportunity to be carried away into the electrode, and thereby be eliminated from the dielectric layer. However, depending on the physics of the charging and discharging mechanism, the quiescent current may not always be the proper mechanism for causing the induced charges to dissipate, in which the quiescent current provides no substantial advantage.

There have been attempts to manipulate the bulk conductivity of the dielectric film to bleed off charges and improve reliability. Unfortunately, these techniques have not proven repeatable or sufficient enough to be generally adopted.

It is, therefore, desirable to provide an improved reliable RF-MEMS capacitive switch, or any electrostatically operated MEMS device involving dielectric layers, which overcomes most, if not all of the disadvantages described above.

BRIEF SUMMARY OF THE INVENTION

An improved RF-MEMS capacitive switch is provided for controlling, routing, and tuning RF wireless circuits and systems, as well as for other uses and applications. The improved RF-MEMS capacitive switch is reliable, effective and efficient.

RF-MEMS capacitive switches can be fabricated with an insulating layer, which comprises a dielectric film that is positioned on top of the bottom electrode. Significantly, in this invention, the dielectric film exhibits a unique nanostructure that provides control of the charging phenomenon via fast transport of injected charges through the grain boundaries of the structure of the material ("fast discharge dielectric layer") providing an efficient way to control the charge build up in the material, bleeding the charges out of the material with a time constant in the microsecond range, thus enabling reliable, long-life ($\geq$100 billion cycles) operation of the RF-MEMS capacitive switches. In this invention, the material used as a "fast discharge dielectric layer" is diamond in any of the microstructures available in thin films, namely: 1) ultrananocrystalline diamond (UNCD) (with grain size in the 2-5 nm range and gain boundaries about 0.4 nm wide), previously patented by Argonne National Laboratory; 2) nanocrystalline diamond (NCD) (with grain size in the range 10-900 nm), and 3) microcrystalline diamond (MCD) (with grain size in the range $\geq$1 micron). The term "fast discharge diamond dielectric layer" is used heretofore in the description of the invention, when referring to the dielectric layer. Desirably, the "fast discharge diamond dielectric layer" has sufficiently short discharging time constant that no matter how many charges are accumulated in the material, the RF-MEMS capacitive switch will recover quickly enough so as to be available for proper operation within a relatively short time span (microseconds to tens or hundreds of microseconds).

Generally, insulating materials for conventional dielectric layers used in prior art RF-MEMS capacitive switches are engineered to avoid dielectric charging and fail very slowly. However, once failure occurs, the recovery time for the switch to be operational again is very long, essentially resulting in permanent failure of the switch and the system in which it is inserted as a critical component. With this invention, the RF-MEMS capacitive switch with a "fast discharge diamond dielectric layer" can experience what colloquially is named and sometime erroneously described as a "failure", but in reality is a short operational interruption (microseconds long), followed by a rapid recovery (in microseconds) to normal operation. In this instance, the so called "failure" of the switch, due to dielectric charging, is moot and the RF-MEMS capacitive switch will operate very effectively despite the charging effect.

The improved radio frequency RF-MEMS) capacitive switch has a quick switching time and can be moved from an "off-state" to an "on-state" in the microsecond range. The RF-MEMS capacitive switch can have: 1) a lower electrode, 2) a mechanically moving membrane (upper electrode), and a "fast discharge diamond dielectric layer" that is grown on the surface of the lower electrode. Significantly, the "fast discharge diamond dielectric layer", UNCD tested for the purpose of this invention, has a discharging time that is substantially less than the switching time. In use, the membrane is spaced from the electrodes in the "off-state" and the membrane contacts the dielectric layer when a voltage is applied across the electrodes in the "on-state". The dielectric layer can have "fast discharge" characteristics and can comprise an insulating layer. Desirably, the "fast discharge diamond dielectric layer" is chemically inert and hydrophobic to substantially prevent tribiological interaction (stiction) of the membrane with the dielectric layer. Preferably, the dielectric layer is made of any of the forms of diamond described above.

Advantageously, the RF-MEMS capacitive switch with the "fast discharge diamond dielectric layer" can recover quickly from the "pseudo-failure", in a period of time ranging from 1 microsecond to 100 microseconds, from an accumulation of electrical charged particles (electrons) in the hulk of the layer. The RF-MEMS capacitive switch with the "fast discharge diamond dielectric layer" is designed and arranged to prevent it from failing due to rapid discharging of the dielectric layer. Desirably, the RF-MEMS capacitive switch can operate with a discharging time less than 50-100 microseconds and is operable for over 100 billion cycles.

The newly invented RF-MEMS capacitive switch with the "fast discharge diamond dielectric layer" in general, or the unique UNCD dielectric layer tested for the purpose of this invention, provides improved reliability. Advantageously, the switch dielectric is designed to have a discharging time constant which is short relative to the required switching time of the device. Since a well-designed RF-MEMS switches typically change state in less than 50 microseconds, it is desirable to have any accumulated charge to dissipate within 50 microseconds.

Significantly, traditional failure of the insulator dielectric layer in prior art RF-MEMS switches, due to dielectric charging, is irrelevant for the switches described in this invention, since the newly invented RF-MEMS capacitive switch, with a UNCD dielectric film, recovers quickly enough to be ready for the next operating cycle. Desirably, the main failure mode for capacitive RF-MEMS switches is circumvented by this invention and the RF-MEMS capacitive switch will have a good reliability set by not only the dielectric, but also the tribological (negligible stiction, due to the hydrophobic nature of the diamons surface) characteristics of the "fast discharge diamond dielectric layer".

Further improvements can be achieved if the charging time constant is made as long as possible. This causes the switch to accumulate charge at a slower rate than one with a short time constant. Irrespective of the charging time constant, if the discharging time constant is made short enough, then an induced charge will quickly dissipate and the device will recover to normal operation very quickly.

In order to provide a long life and reliable RF MEMS capacitive switch with short discharging time constants, the RF-MEMS capacitive switch, tested for the purpose of this patent, includes UNCD as the "fast discharge diamond dielectric layer", instead of conventional silicon oxide or nitride dielectrics, but the other diamond layers would perform similarly. Due to the ultra-small grain sizes (3-5 nm) characteristic of UNCD, and the atomic scale grain boundaries (0.4 nm wide) with mixed $sp^2$ and $sp^3$ carbon chemical bonds, the mean-free-path through the conductive grain boundaries is appropriate to, allow fast transport of charges to recombine very quickly with opposite charged centers or to be carried away out of the material into the electrically conductive electrode for rapid dissipation in the external circuit. Measurements of the charging time constants of UNCD demonstrate a charging time constant of approximately 100 microseconds, which is an order of magnitude faster than for conventional oxide or nitride dielectric layers used in prior art RF-MEMS switches.

While measurements of the specific discharging time constant can be difficult to quantify due to a variety of mitigating circumstances, in the newly invented RF-MEMS capacitive switch described in this patent, full discharging has been demonstrated to be less than 50 microseconds for switch on-times as long as 0.5 seconds.

The paradigm, pattern or example of operation with the newly invented RF-MEMS capacitive switch, tested using the UNCD dielectric layer, is fundamentally different from that of a traditional RF-MEMS capacitive switch with oxide or nitride dielectric layers. For RF-MEMS capacitive switch with a UNCD dielectric film, the discharge time is in the range of microseconds, which is an order of magnitude shorter than for traditional prior art switches with a silicon oxide or silicon nitride dielectric.

In the preferred form, the RF-MEMS capacitive switch is moveable from an "off" position to an "on" position, and comprises: a lower electrode providing a RF signal path; a moveable metal membrane (upper electrode); and a dielectric layer comprising a "fast discharge diamond dielectric layer". Desirably, the switch has sufficient capacitive conductance to capacitively couple or short the RF switch path of the lower electrode to the membrane.

In the remaining portions of the document, the acronyms UNCD is used in the description of the invention, since the main test of RF-MEMS capacitive switches were done using UNCD as the dielectric layer. However, it should be understood that the description applies also to the other forms of diamond films (NCD and MCD) described above.

Preferably, the membrane is spaced from the lower electrode by an air gap in the "off" position and contacts the dielectric layer when a voltage is applied across the lower and upper electrode (membrane) in the "on" position. In the preferred form, the membrane is integrated with the dielectric layer and lower electrode to form a metal-insulator-metal (MIM) capacitor in the "on" position, such that the RF-MEMS capacitive switch with the UNCD dielectric film provides a reliable long-life switch that is operable for at least 100 billion cycles.

A more detailed explanation of the invention is provided in the following detailed descriptions and appended claims taken in conjunction with the accompanying drawings.

BRIEF DESCRIPTION OF THE DRAWINGS

FIG. 3 is a diagram and chart illustrating discharge data for the RF-MEMS capacitive switch, with a UNCD dielectric layer, featured in the picture inserted in the chart.

DETAILED DESCRIPTION OF THE INVENTION

The following is a detailed description and explanation of the preferred embodiments of the invention and best modes for practicing the invention.

Figure 1:
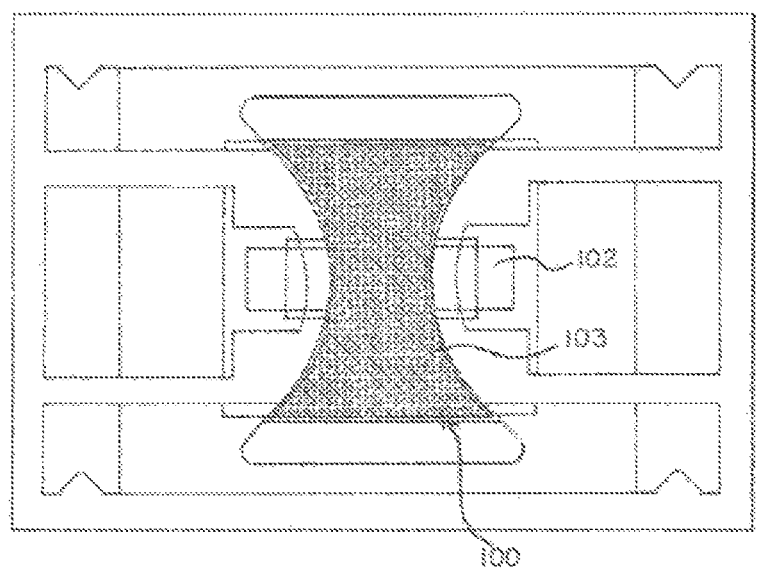
FIG. 1 is an optical microscopy picture of a top plan view of a RF-MEMS capacitive switch with UNCD dielectric layer in accordance with principles of the a first embodiment of the present invention.
Figure 2:
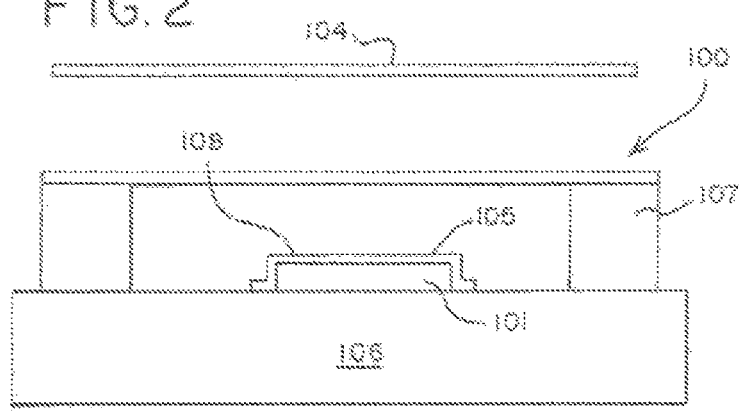
FIG. 2 is a cross-sectional schematic view of a RF-MEMS capacitive switch with a UNCD dielectric layer.

Referring to the drawings, one embodiment of a RF-MEMS capacitive switch (FIGS. 1 and 2) features a moveable metallic membrane 100 from an "off" position in an "off-state" (no applied voltage) to an "on" position in an "on-state" (with applied voltage), in a short switching time. The RF-MEMS capacitive switch can have: 1) a bottom electrode 101 which provides a lower electrode and comprises a metal that provides a RF signal path 102; a moveable metallic membrane 100 (upper electrode) with large array of holes (103) to enable etching of the sacrificial layer underneath the membrane, during switch fabrication, (alternatively, the switch design could incorporate a pull-up upper electrode, also with a diamond layer, above the membrane (104); 3) a "fast discharge diamond dielectric layer" 105, with fast discharge characteristics, and providing a dielectric insulating layer on the bottom electrode (101); 4) a substrate, such as a silicon layer on sapphire (SOS) (106), or SOS-CMOS substrate (106), including CMOS devices to achieve monolithically integrated RF-MEMS switches/CMOS systems, with the CMOS devices driving the RF-MEMS switches (the substrate serves a support for the whole RF-MEMS switch structure, including support for the posts (107) supporting the membrane). The RF-MEMS capacitive switch with the "fast discharge diamond dielectric layer" provides a reliable long-life switch with ≧100 billion operation cycles.

In the preferred embodiment, the moveable metallic membrane is made of molybdenum (Mo), which provides a combination of relatively high conductivity, mechanical robustness, and controlled stress (however, other metals can be used as well, such as tungsten (W), aluminum (Al), titanium (Ti) and more). The membrane can be less than 0.4 μm thick and can be spaced from the bottom electrode by an air gap (108) of about 2 microns to about 10 microns resulting in a substantially insignificant capacitance relative to an operating frequency of the switch. In use, the membrane contacts the dielectric film ("on-sate") when a voltage of about 30 volts to about 50 volts is applied across the top and bottom electrodes. Desirably, the membrane is integrated with the insulating layer and the bottom electrode to form a metal-insulator-metal (MIM) capacitor in the "on state".

In the preferred embodiment, the dielectric film is the "fast discharge diamond dielectric layer" and has a discharging time (about 50 microseconds) substantially less than the switching time. In the illustrative embodiment, the "fast discharge diamond dielectric layer" exhibits a charging time constant of about 100 microseconds.

Use of UNCD provides controlled leakage and allows reliable, long life operation of the switch by eliminating the problem of dielectric charging which is the accumulation of charge within the dielectric layer. The UNCD dielectric material of the RF-MEMS capacitive switch has charge and discharge time constants that are on the order of microseconds to 10 s of microseconds instead of 100 s of seconds for conventional RF-MEMS capacitive switches with an insulating layer of silicon dioxide or silicon nitride. UNCD films have unique charging properties with a very fast time constant which allow longer lifetimes that possible with traditional dielectrics.

In the illustrative embodiment, the bottom electrode comprises tungsten (W) so as to accommodate high temperature UNCD deposition. However, other metals, with much higher conductivity than W, could be used if appropriate materials integration are implemented. For example, the applicants have demonstrated that UNCD films can be grown at ≦400° C. (the temperature required for integration of UNCD with CMOS devices) on Au electrode layers, with a diffusion barrier layer (e.g., TiAl or TiN). The use of electrode layers with high conductivity may be required for optimized devices for very high frequency operations.

Desirably, the newly invented RF-MEMS capacitive switch described here recovers quickly enough for the switch to be available for operation after only a short (microseconds) interruption, followed by a rapid recovery before normal operation. Advantageously, UNCD has low stiction properties, due to the hydrophobic nature of its surface, thus reducing problems related to tribiological interaction between the metal membrane and the dielectric layer, and it is chemically inert.

FIG. 3 shows diagram and chart showing discharge data [(a) and (b)] for RF-MEMS capacitive switchs with UNCD dielectric films grown at different temperatures. FIGS. 3(*a*) and (*b*) show that the discharge time (represented by the Y-axis) is in the range of microseconds, which is orders of magnitude shorter than for conventional switches with a silicon oxide or silicon nitride dielectric layer. In addition, FIG. 3(*b*) shows that the improved UNCD synthesis process (at 400 C, compatible with CMOS processing) provides >1000× improvement in recovery time from dielectric charging, allowing to have the switch on for much longer time.

Figure 4A:
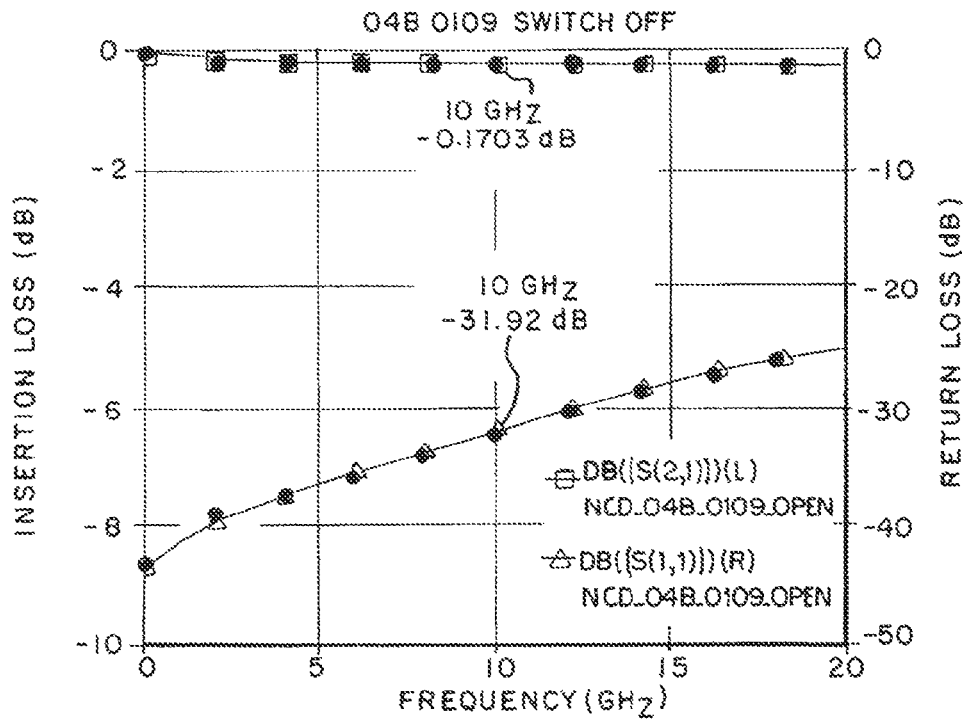
FIG. 4 is a diagram and chart showing the open state insertion loss measurements of a RF-MEMS capacitive switch with a UNCD dielectric layer.
Figure 4B:
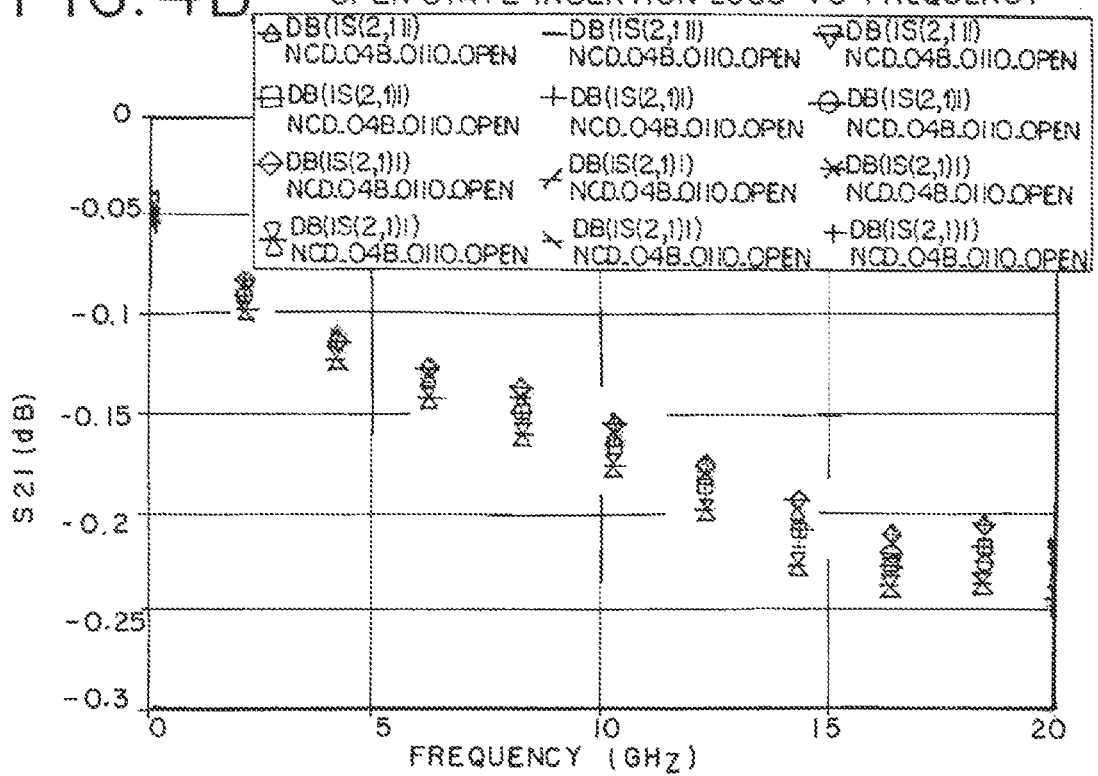

FIG. 4 shows diagrams and charts for insertion/return losses at 10 GHz (a) and open state insertion loss measurements up to 25 GHz (b) of the RF-MEMS capacitive switch with the UNCD dielectric layer. The performance at 10 GHz shows an insertion loss of 0.17 dB. This is extracted from S-pars with: $C_{off}$ at −16 ff, $C_{on}$ at −644 ff, and a $C_{ration}$ of −41.

Figure 5:
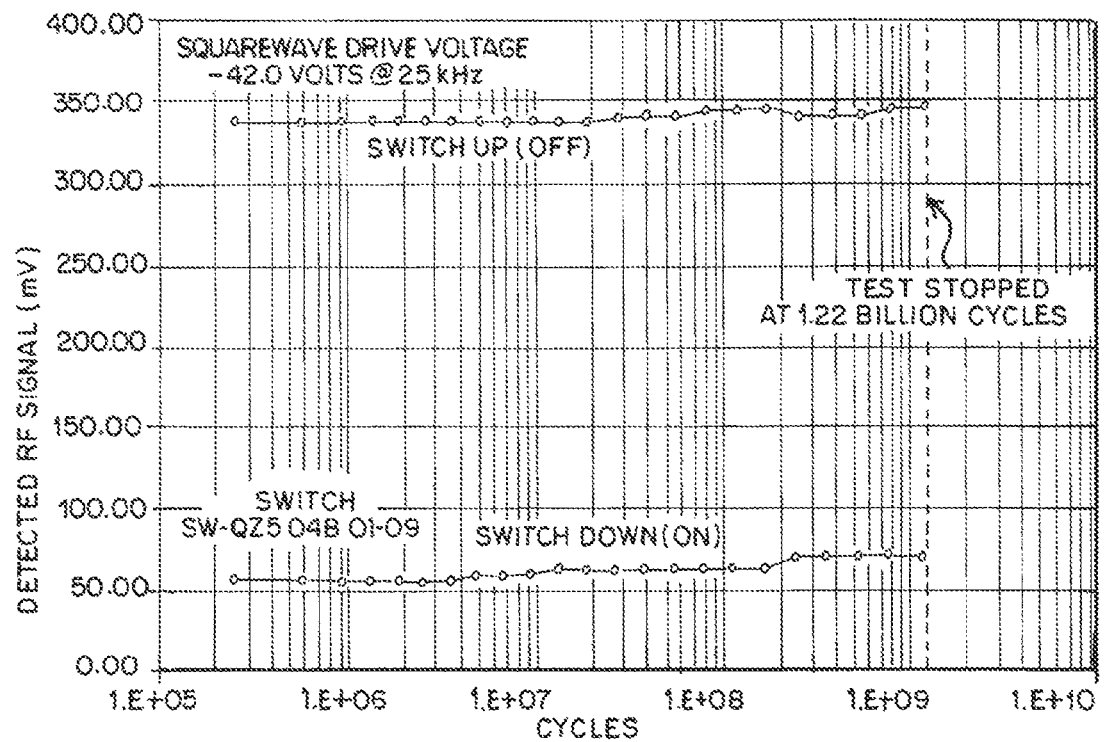
FIG. 5 is a diagram and chart showing a switch life-time of a RF-MEMS capacitive switch with a UNCD dielectric layer.

FIG. 5 is a chart illustrating a switch life-time of the RR-MEMS capacitive switch with the UNCD dielectric layer, which worked successfully for more than one billion cycles (new test demonstrated lifetime of 12 billion cycles—the test was terminated for experimental purposes, although the switch could have remained working). Tests are underway to demonstrate ≧100 billion operation cycles.

Significantly, the RF-MEMS capacitive switch with UNCD as the "fast discharge diamond dielectric layer" exhibits electromechanical performance as good as state-of-the-art RF-MEMS switches with oxide or nitride dielectric layers. However, the RF-MEMS switch with the "fast discharge diamond dielectric layer" exhibits uniquely different charging characteristics, with charging and discharging time constants 5-6 orders of magnitude quicker than those of conventional RF-MEMS switches with oxide or nitride dielectric layers. The RF-MEMS capacitive switches with a UNCD dielectric layer (film) can provide devices which have no adverse effects of dielectric charging and can be operated near-continuously in the actuated state without significant degradation in reliability.

Figure 6:
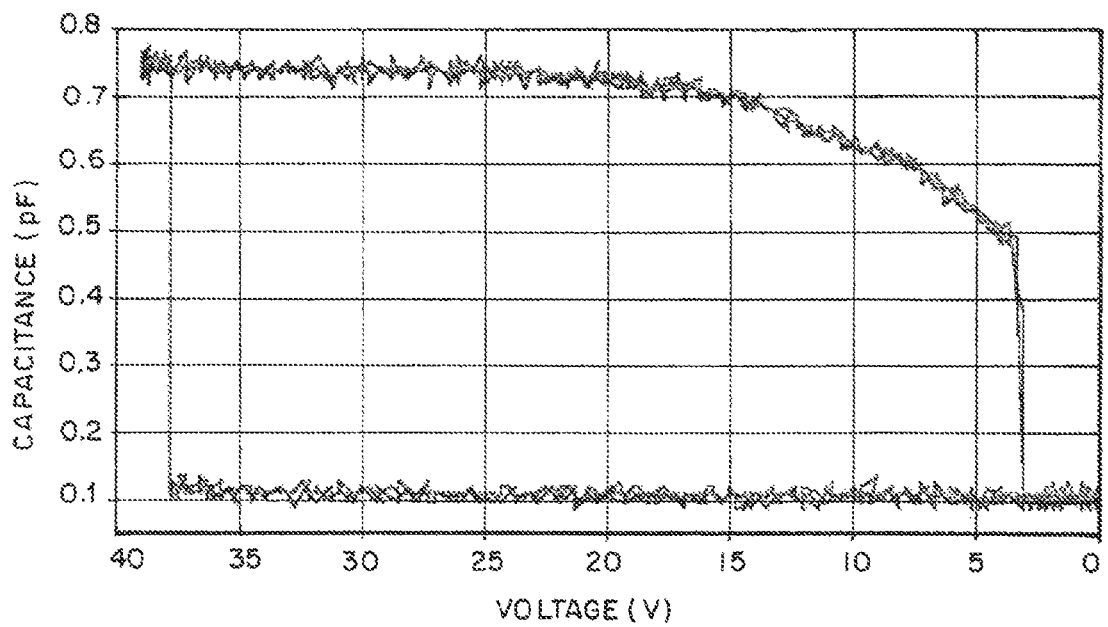
FIG. 6 is a chart showing a C-V curve for a RF-MEMS capacitive switch, with a UNCD dielectric layer, and with a pull-in actuation voltage $V_p$ of about 38 volts.

Characterization of the electromechanical RF-MEMS switch properties typically includes measuring its dynamic operating curve. These properties were measured for the RF-MEMS switches with UNCD dielectric layer, by sweeping bias voltage and measuring the capacitance of the device (C-V curves). A typical characteristic curve is shown in FIG. 6. These switches exhibit actuation voltages in the range of 30-45 volts with an on-capacitance ranging from 650 fF to 800 fF. The on-capacitance is primarily determined by the surface roughness of the lower electrode and the cleanliness of the sacrificial release process. The measured switch off-capacitance ranged from 90 fF to 105 ff, which includes 52 fF of transmission line capacitance. This means that the MEMS plate and fringing capacitance is approximately 38 fF-53 fF.

The DC I-V characteristics of the switch were also measured as part of this characterization. When actuated, 5-25 nA of leakage current flowed through the switch, depending heavily on the operating voltage. To date, there has not been any perceived correlation between UNCD leakage current and the charging properties of these switches.

The RF performance of the RF-MEMS switch with the UNCD dielectric layer is typical of most MEMS capacitive switches. When the shunt switch is in the off-state, the insertion loss is very low, on the order of 0.25 dB at 20 GHz. This is slightly higher than the usual insertion loss of 0.15 dB, and is attributed to the less conductive metal (W) used for the lower electrode, as compared with Au bottom electrodes. When the switch is actuated, isolation is set by the on-capacitance of the device. With 700 fF of on-capacitance, the isolation at 20 GHz is very close to the theoretical value associated with a shunt 700 fF capacitor (7.7 dB). This switch operates more like a switched capacitor (45 fF-725 fF) than a high isolation switch at frequencies below 20 GHz.

By comparison, traditional switch dielectrics such as $SiO_2$ and $SiN_x$ typically have bulk charging and discharging time constants of 10 to 100+ microseconds. As the switches operate, charges build up within their dielectric, and they experience a very gradual change in pull-in and release voltages until the ultimate failure of the switch. With bulk charging, this failure is characterized by the release voltage dropping to zero and the device becoming stuck down. After failure, the switch requires a sufficiently long period of time to recover (in which the charges are eliminated from the dielectric layer through bleeding and/or neutralization) before it is able to release.

After careful measurements, it was determined that switches with UNCD dielectrics have time constants that are 5-6 order of magnitude quicker than those of conventional materials, which are on the order of 100 μS. With these very short time constants, the switch fails very quickly, less than a millisecond after actuation. As is characteristic of bulk charging, the device becomes stuck down. However, after the switch bias is removed, the switch requires a very short time for the charges to dissipate and the switch to release. The switch recovery time is not the typical 5-10 μS switching speed, but is dependent on the amount of charging, which occurred during and after failure. Therefore, the time required for recovery and release is, in part, dependent on the quick-discharge dielectric properties, the applied electric field, and the switch on-time. This invention engineers the quick discharge dielectric properties such that this recovery time is very quick relative to the operating timeline of the MEMS device.

Figure 7:
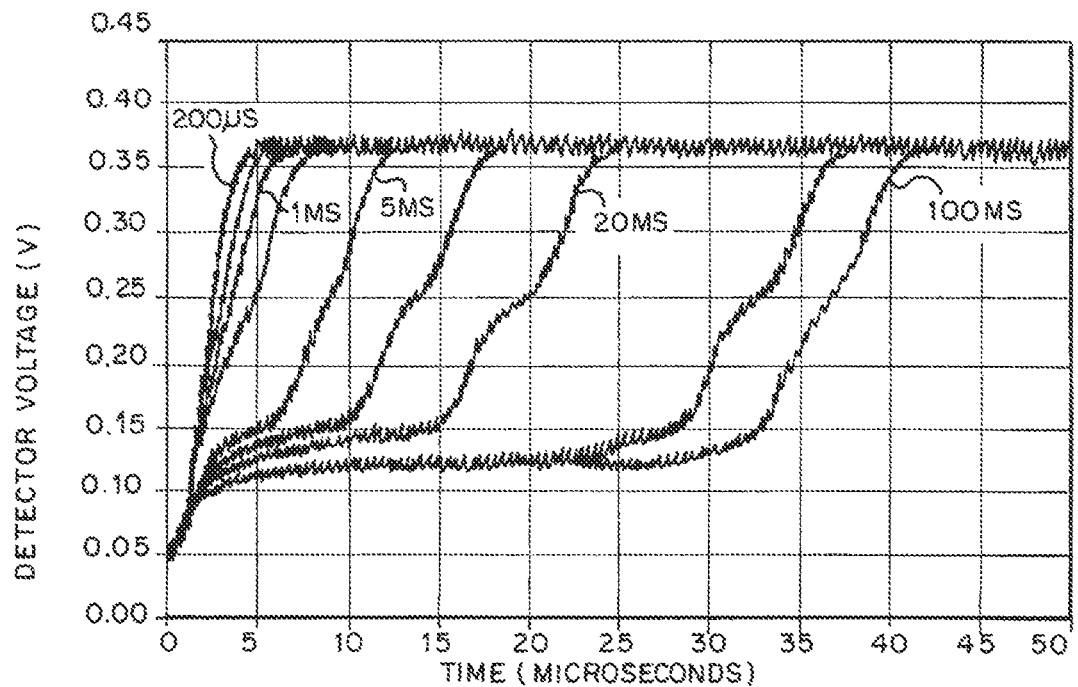
FIG. 7 is a diagram and chart showing time domain measurements of a RF-MEMS capacitive switch, with a UNCD dielectric layer, revealing the switch recovery dependence with switch on-time.

FIG. 7 shows data on the charging/discharging phenomenon, revealing that the release time of the switch is a function of the transmitted RF power, which is the switch on-time. The vertical axis is detector voltage monitoring the position of the membrane. The operating voltage on the lower electrode was −33 volts relative to ground. It can be seen that switch recovery time $t^{OFF}$, can take many hundreds of microseconds depending on the switch on-time, $t^{ON}$. In the most extreme cases, switches required milliseconds to recover.

Figure 8:
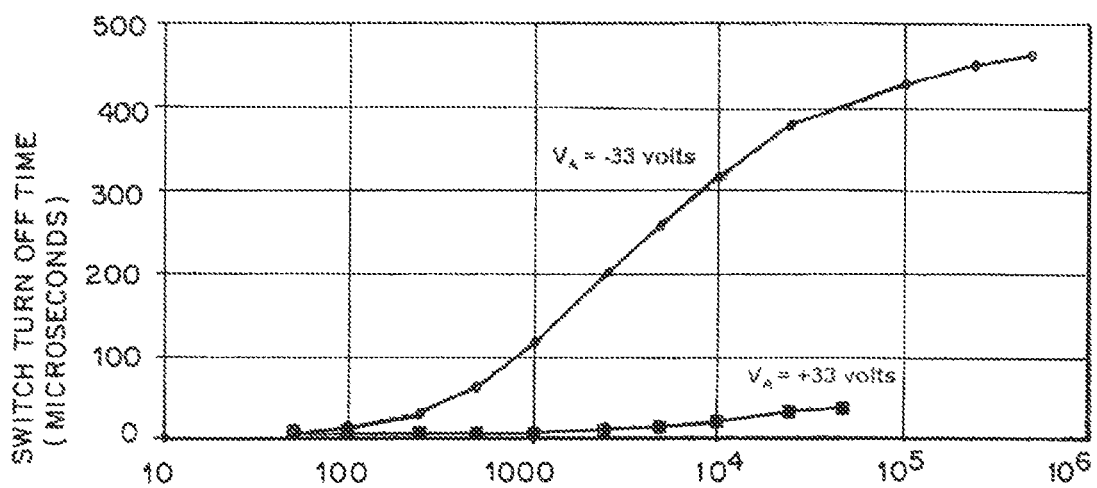
FIG. 8 is a chart showing measurements of the switch recovery tune as a function of switch on-time for a RF MEMS capacitive switch, with a UNCD dielectric layer.

The switch recovery time can be plotted as a function of on-time, and is shown for both positive and negative bias voltages in FIG. 8. FIG. 8 shows that there can be a saturation effect to the induced charge, so the recovery time does not continue to grow significantly with extended switch on-time.

The reason for this uniquely different operation is that the charging and discharging time constants of the UNCD dielectric layer are very short. As the RF MEMS capacitive switch is actuated and charges, bulk charging aids in the actuation of the switch and there is no perceived difference in actuation time. However, the release of the switch is delayed until the accumulated charges have had sufficient, time to recombine and/or dissipate. This has the effect of making the switch release time dependant on the switch on-time and subsequent dissipation of accumulated charges.

While the data provided in FIGS. 7 and 8, provide qualitative characteristics of the charging operation, they do not provide detailed information on the charging characteristics. To better understand the charging phenomenon, pulsed s-parameter measurements were performed to investigate the charging characteristics of the RF MEMS capacitive switch with a UNCD dielectric layer.

A voltage waveform can be used to study dielectric charging of the switches. First, a control voltage of $V^{ON} \geq 33$ V can used to pull in the switch and to charge the dielectric for different $t^{ON}$ times. Next, the control voltage is reduced to $V^{OFF}=0$ and, at 10 μs after the control voltage is reduced from $V^{ON}$ to $V^{OFF}$, the switch capacitance is sampled to see whether or not the switch is released. Usually, the mechanical release process takes less than 10 μs to complete. Therefore, if the switch is released, its capacitance should decrease significantly. Once the switch is confirmed to have been released, $V^{OFF}$ is incremented by 0.1 V for the next charging cycle, after $t^{OFF} \geq 20$ ms to ensure most of the charge is dissipated, and the switch returns to its pristine state at the beginning of the next charging cycle. This way, the cycles are repeated until the switch fails to release after 10 μs and the $V^{OFF}$ then is deemed the release voltage.

Figure 9:
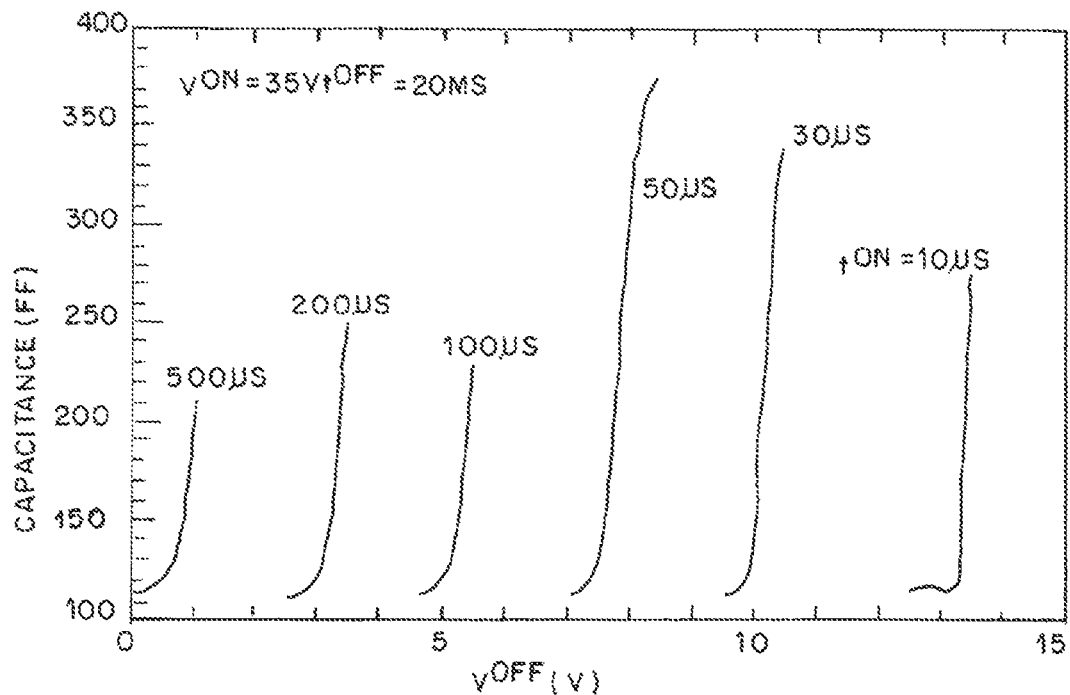
FIG. 9 is a chart showing the dielectric charging in a RF-MEMS capacitive switch, with a UNCD dielectric layer, which reveals a decrease of release voltage as a function of charging time $t^{ON}$, when using 35 volts for actuation of the RF MEMS capacitive switch.

FIG. 9 shows that the release voltage decreases monotonically from 13 V to 0 when the charging time is increased from 10 to 500 μs.

Because the magnitude of the release voltage decreases after charging, charging appears to be in the bulk instead of the surface of UNCD. By assuming the charge distributed in the bulk of UNCD has the same effect as a sheet charge in the middle of the film, the shift in release voltage can be fitted to the following formula:

$$\Delta V = (dQ_0/2\epsilon_0\epsilon_R)[1-\exp(-t^{ON}/\tau_C)]$$

where d is the UNCD thickness, $Q_0$ is the steady-state charge density, 0 is the vacuum permittivity, $\epsilon_R=5.2$ is the diamond film dielectric constant, and $\tau_C$ is the charging time constant.

Figure 10:
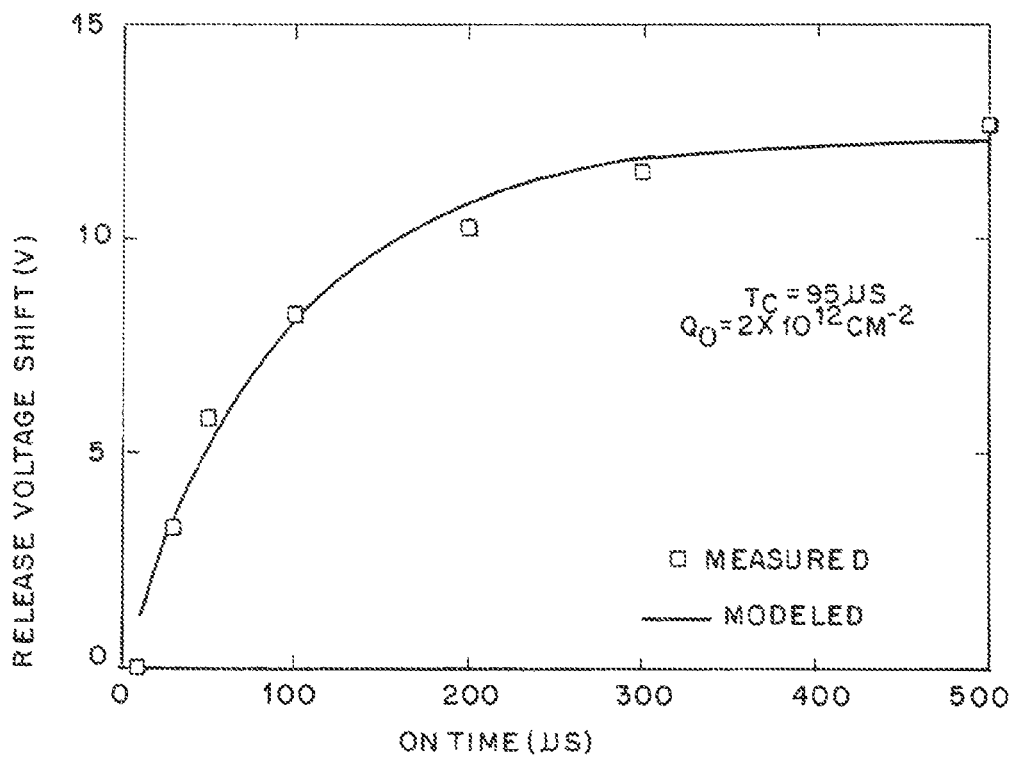
FIG. 10 is a diagram and chart showing measured versus modeled shift in release voltage as a function of charging time under 35 volt actuation for a RF MEMS capacitive switch, with a UNCD dielectric layer.

FIG. 10 shows that the measured release-voltage shift is best fitted with $\tau_C=95$ μs and $Q_0=2\times10^{12}/cm^2$.

Table I lists the charge densities and time constants. These results are in contrast to charging in $SiO_2$ or $SiN_x$, which involves time constants on the order of 10 sec and charge density in the order of $10^{11}$ q/cm², under comparable fields of $10^6$ V/cm.

TABLE I

Charge Density and Time Constant of UNCD Switches

| Wafer | Dielectric Thickness d (μm) | Dielectric Constant $\epsilon_R$ | Switch | Stress Voltage $V^{on}$ (V) | Charge Density Q0 ($10^{12}$/cm²) | Time Constant $\tau_c$ (ms) |
|---|---|---|---|---|---|---|
| 1 | 0.33 | 5.2 | 06C-0110 | +35 | 2.0 | 0.095 |

The measurements described above imply that the UNCD possesses very short charging and discharging time constants. Charge carriers are concentrated at the grain boundaries, and since the grains are nano-sized, they do not have far to travel to diffuse into or out of the dielectric. In essence, the switch pulls down and immediately charges to failure. However, when the applied voltage is removed, the charges leave the dielectric very quickly, depending on how long the switch was in the down position. It is easy to envision conditions under which the switch will recover from charging within a designated switching time interval (e.g. 50 μS). With this mode of operation, the switch will always recover fully from charging before the next switch operation ensues.

RF-MEMS capacitive switches with UNCD dielectric layers can provide three order of magnitude quicker recovery times than conventional prior art RF-MEMS capacitive switches. Switches left "on" for 100 seconds recovered back to their original condition in less than 50 μS. This implies that if switches are cycled off once out of every 100 seconds, they will be fully recovered from any effects of charging and are ready to be reused anew. This means that they only have to be turned off 0.00005% of the timeline to operate without charging failure. Continuous switch operation, is now reasonably achievable for RF-MEMS capacitive switches because of this invention.

The results presented above from tests of RF-MEMS switches with the UNCD dielectric layer demonstrate a new paradigm in switch operation, one that potentially alleviates the scourge of dielectric charging.

The incorporation of UNCD films as a "fast discharge diamond dielectric layer" for RF-MEMS switches has been demonstrated in this invention, and provide the pathway for similar demonstration for the NCD and MCD films described above also. For the first time, this offers the possibility of operating capacitive MEMS switches that are almost continuously "on" without an adverse impact on switch reliability.

Tests of RF-MEMS capacitive switches with a UNCD dielectric layer have shown orders of magnitudes shorter discharging times with respect to RF-MEMS switches using conventional silicon oxide or silicon nitride dielectric layers. RF-MEMS capacitive switches with UNCD dielectric layers have been tested up to 12 billion cycles and show excellent performance.

This invention circumvents the traditional "dielectric charging" failure mode common to capacitive RF-MEMS switches. This enables ultra-low loss, low power consumption, and especially linear operation of MEMS devices to be used in a manner that is repeatable and reliable.

RF-MEMS capacitive switches with a UNCD dielectric layer (film) provide variable capacitors that can be used to control and route microwave and millimeter-wave signals. Uses and applications for the newly invented RF-MEMS capacitive switches can include phase shifters for electronically scanned antenna arrays and tunable filters for spectrum control and anti-jamming. RF-MEMS capacitive switches can be used in military and commercial radar and communications systems.

RF-MEMS capacitive switches with a UNCD dielectric layer can also be used in numerous applications which depend on reliable, immediately available performance: phase shifter for phase array antennas, cell phone communications, industrial automation, PC peripherals, automatic test equipment, medical devices, instruments and military/aerospace equipment. RF-MEMS capacitive switches with a UNCD dielectric layer offer promise of cost effective, high performance devices over a wide range of applications. RF-MEMS capacitive switches with a UNCD dielectric layer can operate in harsh environments with a much longer operating life.

Among the many advantages of newly invented RF-MEMS capacitive switches with a UNCD dielectric layer (film) are:
1. Higher Reliability
2. Longer Life.
3. Shorter time constants.
4. Superior switch capabilities.
5. Outstanding performance.
6. Durable
7. Economical.
8. Efficient.
9. Effective.

Although embodiments of the invention have been shown and described, it is to be understood that various modifications, substitutions, and rearrangements of parts, components, as well as other uses of the RF-MEMS capacitive switch, can be made by those skilled in the art without departing from the novel spirit and scope of this invention.

We claim:

1. A radio frequency microelectromechanical systems (RF-MEMS) capacitive switch, moveable from an "off state" to an "on state" in a short switching time and comprising:
    a lower electrode;
    a membrane providing an upper electrode positioned above said lower electrode, said membrane being spaced from said lower electrode in the "off state";
    a "fast discharge diamond dielectric layer" on said lower electrode having a discharging time substantially less than said switching time; and
    said membrane contacting said "fast discharge diamond dielectric layer" when a voltage is applied across the electrodes in the on state.

2. A RF-MEMS capacitive switch in accordance with claim 1 wherein said "fast discharge diamond dielectric layer" comprises a film with fast discharge characteristics.

3. A RF-MEMS capacitive switch in accordance with claim 1 wherein said "fast discharge diamond dielectric layer" comprises an insulating layer.

4. A RF-MEMS capacitive switch in accordance with claim 3 wherein said switch can recover quickly in a period of time ranging from 1 microsecond to 100 microseconds from an accumulation of electrically charged particles on the layer.

5. A RF-MEMS capacitive switch in accordance with claim 1 wherein said RF-MEMS switch is operable for over 100 billion cycles.

6. A RF-MEMS capacitive switch in accordance with claim 1 wherein said "fast discharge diamond dielectric layer" comprises ultrananocrystalline diamond (UNCD), or nanocrystalline diamond (NCD), or microcrystalline diamond (MCD).

7. A RF-MEMS capacitive switch in accordance with claim 1 wherein said switch is prevented from failing due to rapid discharging of said "fast discharge diamond dielectric layer".

8. A RF-MEMS capacitive switch in accordance with claim 1 wherein said discharging time is less than 50-100 microseconds.

9. A RF-MEMS capacitive switch in accordance with claim 1 wherein said "fast discharge diamond dielectric layer" has a grain size of about 3nm to about 5nm, or 10 nm to 900 nm, or $\geq$ than 1 mirometer.

10. A RF-MEMS capacitive switch in accordance with claim 1 wherein said "fast discharge diamond dielectric layer" is chemically inert and hydrophobic to substantially prevent tribiological interaction of said membrane with said dielectric layer.

11. A radio frequency microelectromechanical system (RF-MEMS) capacitive switch moveable from an "off" position to an "on" position and comprising:
    a lower electrode comprising a RF signal path;
    a moveable metal membrane providing upper electrode, selected from the group consisting of
        (a) a RF ground and a direct current (DC) ground, said membrane positioned above said lower electrode, and said membrane being spaced from said lower electrode by an air gap in the off position; and
        (b) a RF ground and a direct current (DC) ground, positioned above said movable membrane;
    a dielectric layer comprising a "fast discharge diamond dielectric layer", said layer being ultrananocrystalline diamond (UNCD), or nanocrystalline diamond (NCD), or microcrystalline diamond (MCD);
    said membrane contacting said dielectric layer when a voltage is applied across the lower and upper electrodes in the on position;
    said membrane cooperating with said dielectric layer and lower electrode to form a metal-insulator-metal (MIM) capacitor in the on position; and
    said RF-MEMS capacitive switch provides a reliable long-life switch that is operable for at least 100 billion cycles.

12. A RF-MEMS capacitive switch in accordance with claim 11 wherein said switch has sufficient capacitive conductance to capacitively couple or short the RF switch path of said lower electrode to said membrane.

13. A RF-MEMS capacitive switch in accordance with claim 12 wherein said bottom electrode comprises tungsten (W), gold (Au), copper (Cu), aluminum (Al) or any other metal with higher electrical conductivity, including an appropriate atoms diffusion barrier (e.g., TiAl, TiN) to avoid diffusion of metal atoms towards the diamond layer, when growing the diamond layer on top.

14. A radio frequency microelectromechanical (RF-MEMS) capacitive switch, moveable for a switching time from an "off" position in an "off-state" to an "on" position in an "on-state", comprising:
  a bottom electrode comprising metal providing an RF signal path;
  a moveable metallic membrane providing a top electrode, selected from the group consisting of
    (a) an RF ground and a direct current (DC) ground said membrane being less than about 0.4 μm thick, said membrane being spaced from said bottom electrode by an air gap of about 2 microns to about 10 microns resulting in a substantially insignificant capacitance relative to an operating frequency of said switch;
    (b) an RF ground and a direct current (DC) ground, positioned above said membrane;
  a dielectric film with "fast discharge characteristics, providing a "fast discharge diamond dielectric layer" with insulating characteristics on said bottom electrode, said "fast discharge diamond dielectric layer" comprising ultrananocrystalline diamond (UNCD), or nanocrystalline diamond (NCD), or microcrystalline diamond (MCD); said film having a discharging and recovery time substantially less than said switching time for substantially discharging an accumulated charge within 50 microseconds;
  said membrane contacting said "fast discharge diamond dielectric layer" when a voltage of about 30 volts to about 50 volts is applied across said top and bottom electrodes in the on state;
  said membrane cooperating with said "fast discharge diamonddielectric layer" and said bottom electrode to form a metal-insulator-metal (MIM) capacitor in the on state; and
  said RF-MEMS capacitive switch comprises a reliable long-life switch that is operable for more than 100 billion cycles.

15. A RF-MEMS capacitive switch in accordance with claim 14 wherein said "fast discharge diamond dielectric layer" has a charging time constant of about 100 microseconds.

16. A RF-MEMS capacitive switch in accordance with claim 14 wherein said membrane is selected from the group consisting of molybdenum (Mo), tungsten (W), aluminum (Al), titanium (Ti) or any other metal with suitable mechanical and tribological properties.

17. A RF-MEMS capacitive switch in accordance with claim 14 including:
  a silicon on sapphire (SOS) substrate positioned below said bottom electrode; and at least one post extending between said membrane and said SOS Substrate;
  a silicon on sapphire (SOS)-CMOS device arrangement substrate positioned below said bottom electrode to enable monolithical integration of said RF-MEMS switches with said CMOS devices to enable actuation of the RF-MEMS switches by the CMOS devices.

* * * * *